United States Patent
Opoku-Adusei et al.

(10) Patent No.: US 6,589,310 B1
(45) Date of Patent: Jul. 8, 2003

(54) HIGH CONDUCTIVITY COPPER/ REFRACTORY METAL COMPOSITES AND METHOD FOR MAKING SAME

(75) Inventors: Mark Opoku-Adusei, Tucson, AZ (US); David E. Jech, Tuccon, AZ (US); Juan L. Sepulveda, Tucson, AZ (US)

(73) Assignee: Brush Wellman Inc., Cleveland, OH (US)

( * ) Notice: Subject to any disclaimer, the term of this patent is extended or adjusted under 35 U.S.C. 154(b) by 0 days.

(21) Appl. No.: 09/571,809

(22) Filed: May 16, 2000

(51) Int. Cl.⁷ .......................... C22C 1/04; C22C 27/00; C22C 27/04
(52) U.S. Cl. ............................................. 75/245; 75/248
(58) Field of Search ............................ 75/247, 245, 248

(56) References Cited

U.S. PATENT DOCUMENTS

| | | | |
|---|---|---|---|
| 2,362,007 A | | 11/1944 | Hensel et al. |
| 3,890,145 A | * | 6/1975 | Hivert et al. .................. 75/224 |
| 4,009,007 A | * | 2/1977 | Fry ........................... 29/182.5 |
| 4,012,230 A | * | 3/1977 | Dickinson et al. ............. 75/212 |
| 4,090,875 A | * | 5/1978 | Ludwig ........................ 75/248 |
| 4,141,719 A | * | 2/1979 | Hakko .................... 75/0.5 BB |
| 4,299,629 A | * | 11/1981 | Haack .......................... 75/251 |
| 4,381,942 A | * | 5/1983 | Blum et al. .................... 419/23 |
| 5,686,676 A | | 11/1997 | Jech et al. |
| 5,689,796 A | | 11/1997 | Kasai et al. |
| 5,889,220 A | | 3/1999 | Akiyoshi et al. |
| 5,905,938 A | | 5/1999 | Akiyoshi et al. |
| 5,993,731 A | | 11/1999 | Jech et al. |

OTHER PUBLICATIONS

Condensed Chemical Dictionary, 10$^{th}$ ed., pp. 808–809, 1981.*

Johnson, J.L., PhD, "Densification, Microstructural Evolution, and Thermal Properties of Liquid Phase Sintered Composites," *Thesis in Engineering Science and Mechanics*, The Pennsylvania State University, Aug. 1994, pp. 85, 86, 88, 90, 91, 155, 163.

Srikanth et al., "Sintering of W–Cu–Ni Heavy Alloys with Phosphide Addition," *Sintered Metal–Ceramic Composites*, Elsevier Science Publishers B.V., Amsterdam 1984, pp. 297–300.

Srikanth et al., "Effect of Ni$_2$P Addition on Sintered W–Cu–Ni Heavy Alloys," *R&HM*, Sep. 1985, pp. 138–142.

* cited by examiner

Primary Examiner—Daniel J. Jenkins
(74) Attorney, Agent, or Firm—Calfee, Halter & Griswold LLP

(57) ABSTRACT

The thermal conductivity, thermal conductivity, of a sintered copper/refractory metal composite having a maximum porosity of about 1% is greatly improved when the composite contains phosphorus and sintering aid in a specified weight ratio, "phosphorus/sintering aid ratio." The copper/refractory matrix composite herein comprises, by weight, from about 5% to about 30% copper, from about 0.2% to about 0.6% sintering aid, from about 0.08% to about 0.3% phosphorus, the remaining metal is refractory metal. The phosphorus to sintering aid ratio ranges from about 0.25 to about 0.55. In one embodiment of the invention the sintering aid contains cobalt and the refractory metal is tungsten.

20 Claims, 5 Drawing Sheets

HIGH CONDUCTIVITY COPPER/ REFRACTORY METAL COMPOSITES AND METHOD FOR MAKING SAME

FIELD OF THE INVENTION

This invention relates generally to metal matrix composites and a process for making such composites. More specifically, this invention relates to copper/refractory metal matrix composites for use in microelectronic packages.

BACKGROUND

A metal matrix composite is a material that contains at least two metals, one of which is copper and the other is a refractory metal having a substantially higher melting point. Copper/refractory metal matrix composites are commonly used as substrates or carriers within microelectronic packages. A microelectronic package generally includes a heat-generating component, such as, for example, a chip die that is mounted onto a metal matrix composite used as a substrate. The metal matrix composite functions to transfer heat away from the microelectronic package while also maintaining dimensional stability under wide temperature fluctuations. The thermal conductivity and the coefficient of thermal expansion (CTE) of the composite can be controlled by varying the copper/refractory metal weight ratios based upon the design considerations of various end use applications.

Copper/refractory metal composites can be economically produced using powder metallurgy ("P/M") technology. Metal matrix composites are typically manufactured using either the "infiltration" or the "press and sinter" process, and there are different advantages associated with each. In the infiltration process, refractory metal is press-molded into a shape and sintered to form a highly porous article. Molten copper is then infiltrated into the voids and interstices of the refractory metal to form a dense copper/refractory metal matrix composite. The infiltration process generally cannot be used to produce net shape parts. Rather, the parts produced by infiltration must be either pressed again via a second compaction process or be machined into final shape. In the press and sinter process, powdered copper and refractory metals are blended in prescribed proportions and then compacted and sintered to provide net shape or near net shape metal parts. Such parts can achieve composite densities greater than 99% of theoretical density, with a concomitant porosity of less than about 1%. One press and sinter process is described in U.S. Pat. Nos. 5,686,676 and 5,993,731 to Jech et al. These patents teach that when a compact of metal particles contain oxygenated copper, improved particle rearrangement and densification is achieved during sintering.

A disadvantage of the press and sinter process, however, is that the powder mix typically requires the addition of sintering aids, such as, for example, cobalt, iron or nickel. Sintering aids have many processing advantages, but they are known to deleteriously affect the thermal conductivity of the finished composite, even in small concentrations. Sintering aids are used to reduce the porosity and increase the density of the sintered parts by improving the diffusion of the copper and refractory metal powders during the sintering process. Sintering aids also improve processing conditions by achieving good metal diffusion throughout a wider sintering temperature range. The wider processing window allows for improved consistency in the quality of the production parts. Copper/refractory metal composites made without a sintering aid generally have a higher thermal conductivity than a composite containing the same copper concentration with sintering aid. However, composites that are made without a sintering aid are unacceptable in many applications because they can have a porosity of up to 5%. In microelectronic packaging applications, for example, a measured porosity of less than about 1% is generally required. Voids are particularly noticeable if the composite is machined or cut. Even if the composite is not cut, problems associated with porosity are manifested in defects such as blisters and staining during plating. A porosity of about 2% or more negatively affects the physical characteristics of copper/refractory metal composites, including for example, thermal conductivity. (See, "Densification, Microstructural Evolution, and Thermal Properties of Liquid Phase Sintered Composites", Johnson, J. L., PhD Thesis in Engineering Science and Mechanics, The Pennsylvania State University, Department of Engineering Science and Mechanics, August 1994.) Thus, although composites made with sintering aids have a lower thermal conductivity they are, nevertheless, preferred in many applications because of their comparatively low porosity.

U.S. Pat. Nos. 5,889,220 and 5,905,938 disclose that copper/tungsten ("Cu/W") composites containing small quantities of phosphorus, i.e., 0.07% by weight or less, and cobalt as a sintering aid have a thermal conductivity that is useful in microelectronic applications. Specifically, U.S. Pat. No. 5,889,220 shows that the thermal conductivity of sintered Cu/W composites containing 10% copper and 0.2% cobalt is improved when the amount of phosphorus is less than 0.05% by weight, but is detrimentally affected by an amount of phosphorus of 0.05% or greater. The thermal conductivity of sintered Cu/W composites containing 20% copper and 0.2% cobalt is improved when the amount of phosphorus is 0.07% by weight or less, but is detrimentally affected by greater amounts of phosphorus. These patents show that a problem exists in achieving a high thermal conductivity when 10% and 20% copper/tungsten composites are made with 0.2% cobalt and contain an amount of phosphorus that is greater than 0.07% by weight.

It is desirable, therefore, to provide metal matrix composites and a process for making such composites, that have low porosity, high density and an improved thermal conductivity. It is desirable to provide copper/refractory metal composites that have improved thermal conductivity and low porosity when the sintering aid is about 0.2% by weight or greater. It is also desirable to provide microelectronic packages that achieve better dissipation of heat. It is further desirable to provide a process for making high quality net shape or near net shape metal matrix composites having improved thermal conductivity and a porosity of less than about 1% in a consistent manner.

SUMMARY OF THE INVENTION

The present invention provides copper/refractory metal matrix composites, and a process for making such composites, that have improved thermal conductivity and a maximum porosity of about 1%. The press and sintered copper/refractory metal composites of this invention containing sintering aid and phosphorus additives have improved thermal conductivity compared to similar press and sintered copper/refractory composites containing the same amount of sintering aid but no phosphorus. Also, the thermal conductivity of the composites herein approaches, or is nearly equivalent to, the thermal conductivity of copper/refractory metal composites that contain no additives, i.e., composites that contain the same amount of copper, but the balance is refractory metal. The performance, in terms of thermal conductivity, depends upon the weight ratio of phosphorus and sintering aid (the "phosphorus/sintering aid ratio") in the composite. Surprisingly, it has been found that it is the weight ratio of phosphorus and sintering aid present in the composite that affects the thermal conductivity of the composite rather than the individual amounts of phosphorus and sintering aid.

The thermal conductivity of a composite of the present invention is improved when the phosphorus/sintering aid ratio is from about 0.25 to about 0.55, preferably from about 0.27 to about 0.55, more preferably from about 0.28 to about 0.45, even more preferably from about 0.27 to about 0.4, and yet even more preferably from about 0.3 to about 0.38. The copper/refractory metal composites of the present invention comprise by weight from about 5% to about 30%, preferably from about 8% to about 22%, more preferably from about 9% to about 21%, even more preferably from about 10% to about 20% and yet even more preferably from about 10% to about 15% copper; from about 0.2% to about 0.6%, preferably from greater than about 0.2% to about 0.5%, more preferably from about 0.25% to about 0.45%, even more preferably from about 0.28% to about 0.4%, and even yet more preferably from about 0.3% to about 0.4% sintering aid; from about 0.08% to about 0.3%, preferably from about 0.09% to about 0.28%, more preferably from about 0.9% to about 0.24%, and even more preferably from about 0.09% to about 0.16% phosphorus; and the remainder is refractory metal.

In one embodiment of the invention the copper/refractory metal composites contain cobalt as the sintering aid and tungsten as the refractory metal. The copper/tungsten (Cu/W) composites having a copper concentration of about 5%, 10%, 15%, 20% and 30% copper have a thermal conductivity of up to about 153 W/mK, about 180 W/mK, 204 W/mK, about 212 W/mK and about 224 W/mK, respectively.

In another embodiment of the present invention the copper/refractory metal composites are used as substrates to which heat-generating components can be attached, such as, for example, a chip die in the production of microelectronic packages. The substrates made from the copper/refractory metal composites of the present invention have improved thermal conductivity and low porosity, thereby improving the dissipation of heat generated within the package.

The process for making copper/refractory metal composites of the present invention comprises: selecting powdered metals comprising copper, sintering aid, phosphorus and refractory metal, at least one of the copper and the refractory metal containing chemically-bound oxygen in an amount sufficient to improve a sintering process; mixing the powdered metals to produce a mixture of powdered metals, forming a green compact with the mixture of powdered metals, and sintering the green compact containing chemically-bound oxygen in a reducing atmosphere to form a copper/refractory metal composite comprising by weight from about 5% to about 30% preferably from about 8% to about 22%, more preferably from about 9% to about 21%, even more preferably from about 10% to about 20%, and yet, even more preferably from about 10% to about 15% copper, from about 0.2% to about 0.6%, preferably from greater than about 0.2% to about 0.5%, more preferably from about 0.25% to about 0.45%, even more preferably from about 0.28% to about 0.04%, and yet even more preferably from about 0.3% to about 0.4% sintering aid, from about 0.08% to about 0.3%, preferably from about 0.09% to about 0.28%, more preferably from about 0.09% to about 0.24%, and even more preferably from about 0.09% to about 0.16% phosphorus, and the remainder is refractory metal.

In one aspect of the process the chemically-bound oxygen is present in the form of copper oxide. In another aspect of the process the green compact is exposed to moisture during sintering. The resulting sintered composite is a net shape or near net shape part that has a density that is at least 99% of theoretical, a porosity less than about 1%, and improved thermal conductivity compared to a similar copper composite that contains the same amount of sintering aid but no phosphorus and with the remainder being refractory metal.

DESCRIPTION OF THE DRAWINGS

The present invention may be more readily understood by reference to the following drawings wherein:

FIG. 3(a) is a scanning electronic microscope (SEM) cross-section micrograph of a pressed and sintered 15/85 Cu/W composite that contains no sintering aid and no phosphorus;

FIG. 3(b) is a scanning electronic microscope (SEM) cross-section micrograph of a pressed and sintered 15/85 Cu/W composite of the present invention that contains about 0.3% by weight cobalt and about 0.1% by weight phosphorus;

DETAILED DESCRIPTION OF THE INVENTION

Figure 1:
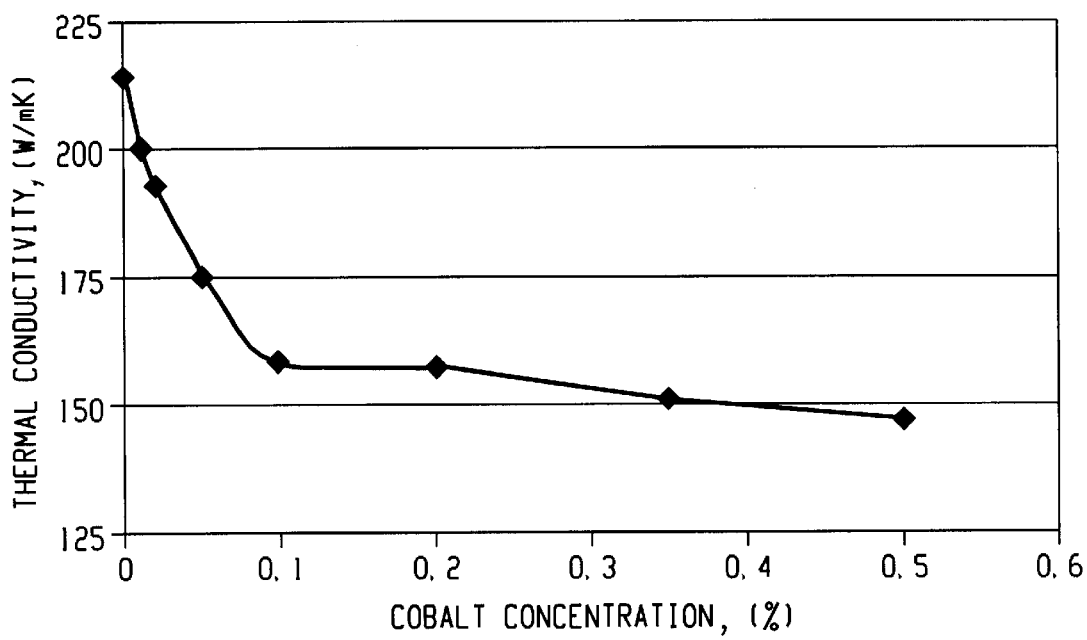
FIG. 1 is graph illustrating the measured thermal conductivity (thermal conductivity) as a function of cobalt concentration for several 15% Cu/W sintered composites of the prior art that do not contain phosphorus.

In accordance with the present invention, sintered copper/refractory metal composites containing sintering aid and phosphorus have a maximum porosity of about 1% and show improved thermal conductivity over similar sintered composites that contain sintering aid but do not contain phosphorus. Sintering aids such as cobalt, nickel and iron, when present in a compact during sintering, improves material diffusion but negatively affects the thermal conductivity of the resulting metal matrix composite, usually in proportion to sintering aid concentration. However, the negative effects of the impurities on the thermal conductivity of the composite are minimized if the sintering aid and phosphorus are present within a specified weight ratio.

The thermal conductivity of a copper/refractory composites of the present invention is improved when the phosphorus/sintering aid ratio is from about 0.25 to about 0.55, preferably from about 0.27 to about 0.55, more preferably from about 0.28 to about 0.45, even more preferably from about 0.27 to about 0.4, and yet even more preferably from about 0.3 to about 0.38. The copper/refractory metal composites of the present invention comprise by weight from about 5% to about 30%, preferably from about 8% to about 22%, more preferably from about 9% to about 21 %, even more preferably from about 10% to about 20% and yet even more preferably from about 10% to about 15% copper; from about 0.2% to about 0.6%, preferably from greater than about 0.2% to about 0.5%, more preferably from about 0.25% to about 0.45%, even more preferably from about 0.28% to about 0.4%, and even yet more preferably from about 0.3% to about 0.4% sintering aid; from about 0.08% to about 0.3%, preferably from about 0.09% to about 0.28%, more preferably from about 0.9% to about 0.24%, and even more preferably from about 0.09% to about 0.16% phosphorus; and the remainder is refractory metal. Refractory metals include, but are not limited to, tungsten, molybdenum, chromium, iridium, osmium, tantalum, niobium, ruthenium, rhenium, rhodium, hafnium, zirconium and mixtures thereof.

The presence of additives in a compact during sintering is generally known to reduce thermal conductivity of a copper/refractory metal composite because residual additives tend to alloy with the copper during sintering. In such cases, the thermal conductivity is lowered. This is most likely due to changes in the microstructure of the copper where electrons can no longer move freely, resulting in lower electrical and thermal conductivity. While applicants do not wish to be held to a particular theory, it is believed that sintering aid and phosphorus when present in a particular phosphorus/sintering aid ratio form a metalloid during sintering. The formation of metalloid nodules reduces the residual sintering aid and phosphorus in solution in the copper phase. It is believed that the phosphorus/sintering aid ratio has bearing on the degree of formation of a metalloid, and consequently, the degree of improvement in thermal conductivity.

In one embodiment of the invention the sintering aid is cobalt and the refractory metal is tungsten. It is believed that a metalloid containing cobalt, phosphorus and refractory metal is formed during sintering. In additional embodiments where the copper/refractory metal matrix composites contain iron or nickel as the sintering aid, it is believed that metalloids containing phosphorus and sintering aid will form during sintering to yield composites having improved thermal conductivity. For example, metalloids containing phosphorus and iron, phosphorus and nickel or metalloids containing phosphorus and two or more sintering aids can form during sintering. So long as a copper/refractory metal composite contains phosphorus and a sintering aid according to a phosphorus/sintering aid ratio as defined herein, the detrimental affect of additives can be minimized. However, if the concentration of sintering aid relative to the copper is too great, the residual amount of the additives negatively affects the thermal conductivity of the composite.

The copper-based metal matrix composites herein can be used as a substrate within a microelectronic package. Heat-generating components, such as, for example, chip die are attached to the substrate. The metal matrix composites containing phosphorus and a sintering aid in the preferred range of phosphorus/sintering aid ratios improve the dissipation of heat generated by heat-generating components attached thereon, and consequently, improve the overall heat dissipation of the microelectronic package. Copper/refractory metal composites used as substrates in microelectronic applications generally contain by weight about 5% to about 30% copper, and more typically about 10% to about 20% copper. A minimum copper content of about 5% is generally required to conduct heat effectively from the heat-generating component. Composites that contain greater than about 30% copper have a coefficient of thermal expansion ("CTE") that is too high in most applications. A high CTE causes high stress on the heat generating component, for example a chip, during thermal cycling which can shorten its useful life or cause it to break.

FIG. 1 is a graph illustrating the measured thermal conductivity as a function of the cobalt concentration up to about 0.5 % by weight, for several press and sintered 15/85 Cu/W composites of the prior art made by pressing and sintering. The graph clearly shows a sharp decline in thermal conductivity as the cobalt concentration increases from 0 to 0.1% by weight. As can be seen from FIG. 1 the thermal conductivity of a sintered 15/85 Cu/W composite containing substantially no sintering aid is about 215 W/mK, whereas the thermal conductivity of sintered 15/85 Cu/W composites containing about 0.05% and 0.1% by weight cobalt is about 175 W/mK and 159 W/mK, respectively. The sintered composite containing substantially no additives has a porosity greater than about 1% and is unsuitable for many microelectronic applications.

Figure 2:
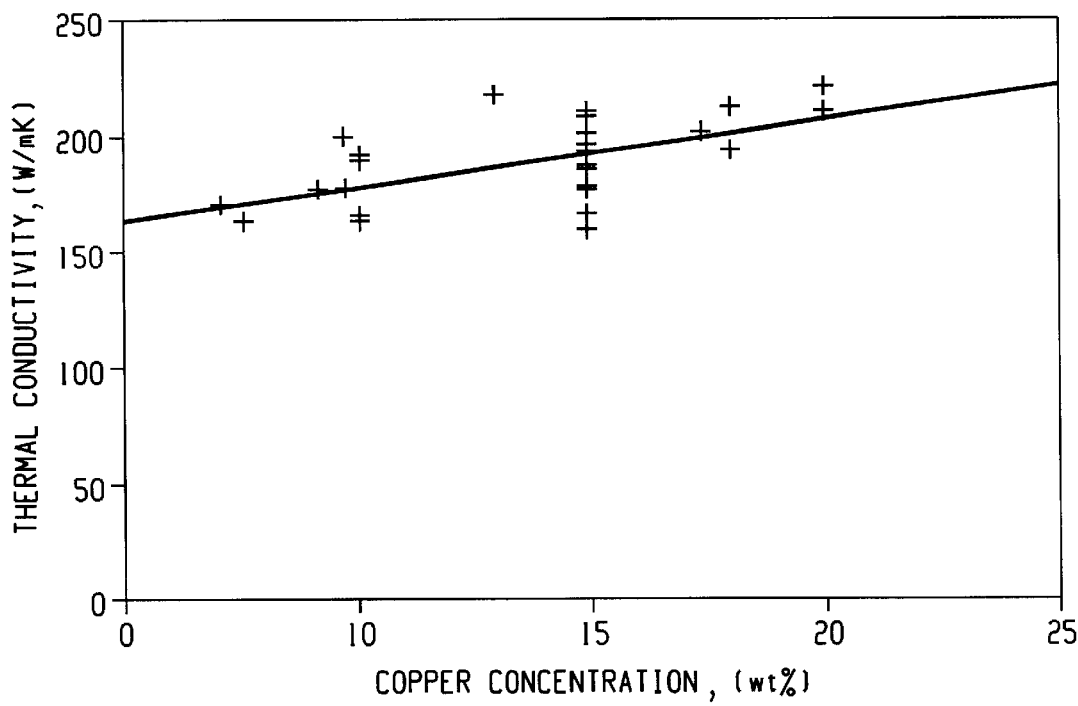
FIG. 2 is a graph illustrating the measured thermal conductivity as a function of copper concentration for Cu/W composites of the prior art.

FIG. 2 is a graph showing the thermal conductivity of several prior art Cu/W composites having increasing copper concentration, from 5% to 25% by weight copper with the remainder tungsten. The composites are made by the press and sinter method and do not contain any sintering aids or phosphorus. The data is from "Densification, Microstructural Evolution, and Thermal Properties of Liquid Phase Sintered Composites," Johnson, J. L., PhD Thesis in Engineering Science and Mechanics, The Pennsylvania State University, Department of Engineering Science and Mechanics, August 1994. A comparison of FIG. 1 and FIG. 2 show that the press and sintered 15% copper/tungsten composites without sintering aid additives have a substantially higher thermal conductivity than the composites that contain cobalt as a sintering aid.

The significant improvement in porosity of a copper/refractory metal composite containing sintering aid is shown in the scanning electronic microscope (SEM) cross-section micrographs of FIGS. 3(a) and 3(b). The micrographs of 25× magnification reveal the differences in the microstructure of composites that were sintered with and without the use of a sintering aid. FIG. 3(a) is a micrograph of a 15/85 Cu/W composite that contains no sintering aid. The composite shown has a porosity of 3.5%, or a fired density of 96.5% of theoretical, and shows several voids throughout its cross-section. FIG. 3(b) is a micrograph of a 15/85 Cu/W composite of the invention herein that contains 0.3% by weight cobalt and 0.1% by weight phosphorus, or a P/Co ratio of 0.33. The composite has a porosity of less than 1% and has no visible porosity.

FIGS. 4(a) through 4(e) illustrate the measured thermal conductivity of several composite compositions of the invention herein as a function of the phosphorus/cobalt ("P/Co") ratio. The thermal conductivity for Cu/W composites containing about 5%, 10%, 15%, 20% and 30% by weight copper correspond to the data provided in Tables 1 through 5 of Examples 1 through 5 below. Unless otherwise stated, all thermal conductivity measurements were calculated from measurements taken according to the Laser-Flash Method ASTM E1561-92. The porosity of all composites was about 1% or less. The porosity of each composite was calculated from the density which was measured by the Archimedes Method ASTM C373-88 (Reapp. 1994). Each figure shows two or more curves where each curve corresponds to several composites containing various amounts of phosphorus at a fixed cobalt concentration.

Each of the FIGS. 4(a) through 4(e) shows a line with arrows labeled the "range of preferred P/Co ratios." Composite compositions of the present invention that are within the range of preferred P/Co ratios have a thermal conductivity that is at or above the minimum acceptable thermal conductivity. The minimum acceptable thermal conductivity is a level that corresponds to the minimum thermal conductivity at which copper/refractory metal composites of a given copper concentration are useful in many applications, such as for example, microelectronic applications. Composites of the present invention having a P/Co ratio within the range of preferred P/Co ratios have a thermal conductivity which is greater than or equal to the thermal conductivity of similar composites containing the same amount of copper and cobalt but no phosphorus and the remainder is refractory metal.

Figure 4A:
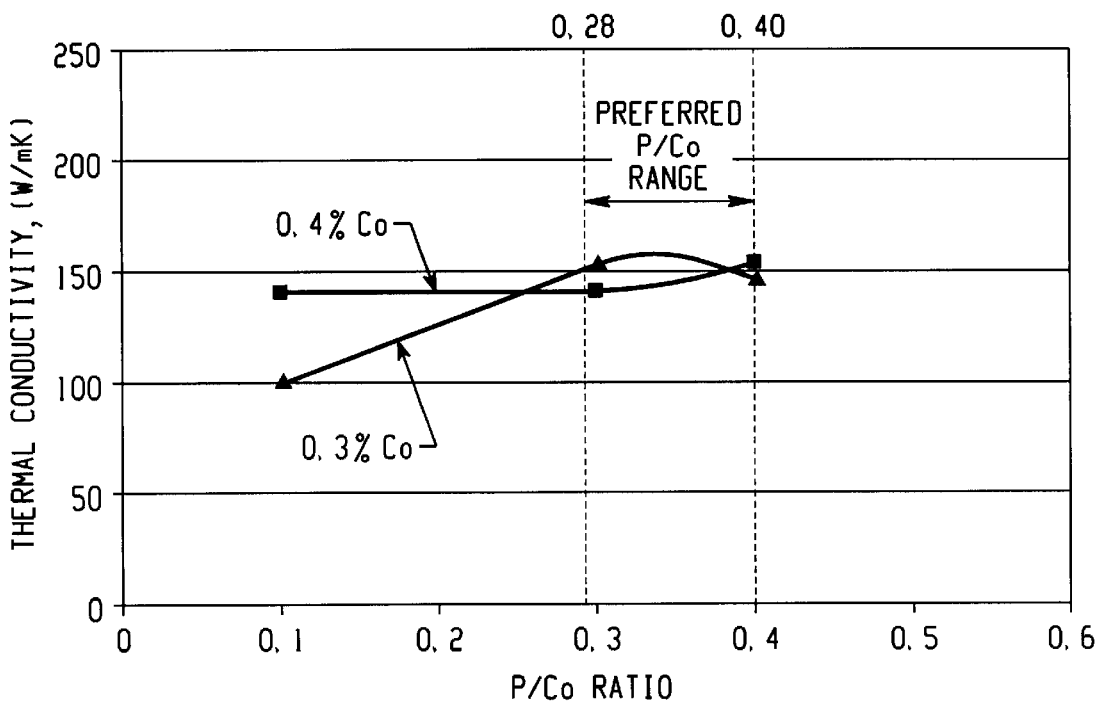
FIG. 4(a) is a graph illustrating the thermal conductivity as a function of the P/Co ratio for several 5/95 Cu/W composites containing about 0.3 and about 0.4 wt. % cobalt sintering aid.

FIG. 4(a) illustrates the thermal conductivity of 5% Cu/W composites as a function of the P/Co ratio. A 5% Cu/W composite containing by weight from about 0.3% to about 0.4% cobalt, from about 0.08% to about 0.16% phosphorus and the remainder tungsten had a minimum acceptable thermal conductivity of at least about 145 W/mK when the P/Co ratio was within the range of preferred P/Co ratios of about 0.28 to about 0.4, as indicated by the horizontal line with arrows. The thermal conductivity of the composites was about 152 W/mK or greater when the P/Co ratio ranged from about 0.3 to about 0.4. A maximum thermal conductivity of about 160 W/mK was observed.

Figure 4B:
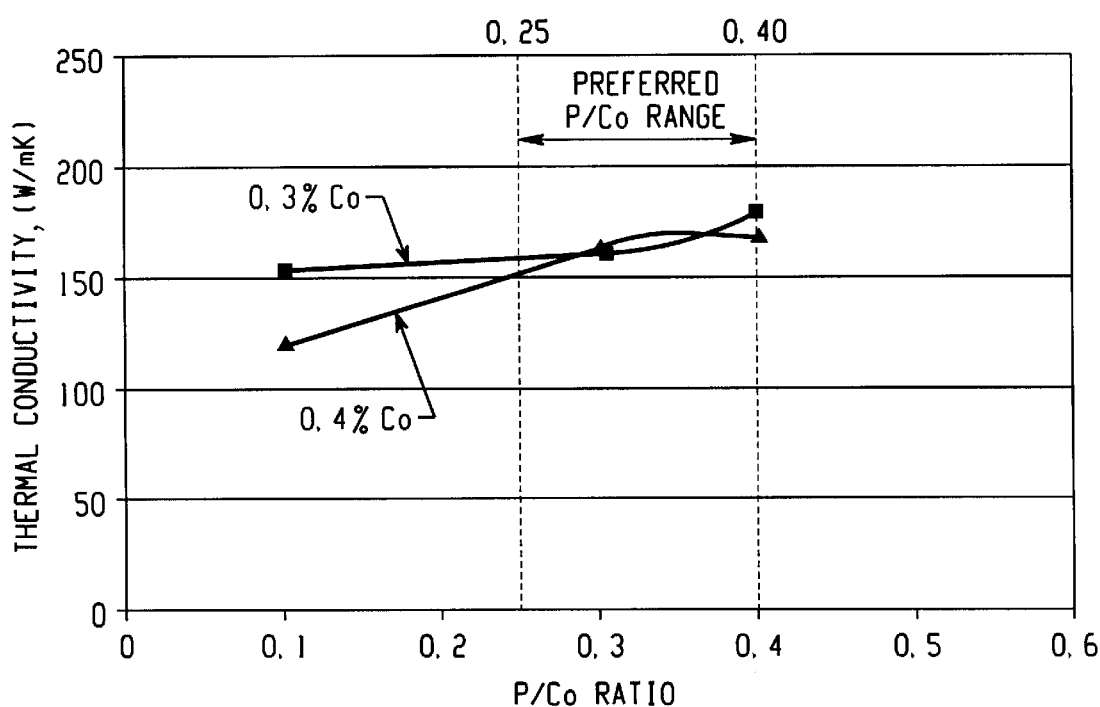
FIG. 4(b) is a graph illustrating the thermal conductivity as a function of the P/Co ratio for several 10/90 Cu/W composites containing about 0.3 and about 0.4 wt. % cobalt sintering aid.

FIG. 4(b) illustrates the thermal conductivity of 10% Cu/W composites as a function of the P/Co ratio. The 10% Cu/W composites containing by weight from about 0.3% to about 0.4% cobalt, from about 0.09% to about 0.16% phosphorus and the remainder tungsten had a minimum acceptable thermal conductivity of about 155 W/mK when the P/Co ratio was within the preferred range of P/Co ratios of about 0.25 to about 0.4. The data show that the thermal conductivity of 10% Cu/W composites was at least about 162 W/mK when the cobalt concentration was from about 0.3% to about 0.4% and the P/Co was from about 0.3 to about 0.4. The maximum measured thermal conductivity of a 10% Cu/W composite was about 180 W/mK.

Figure 4C:
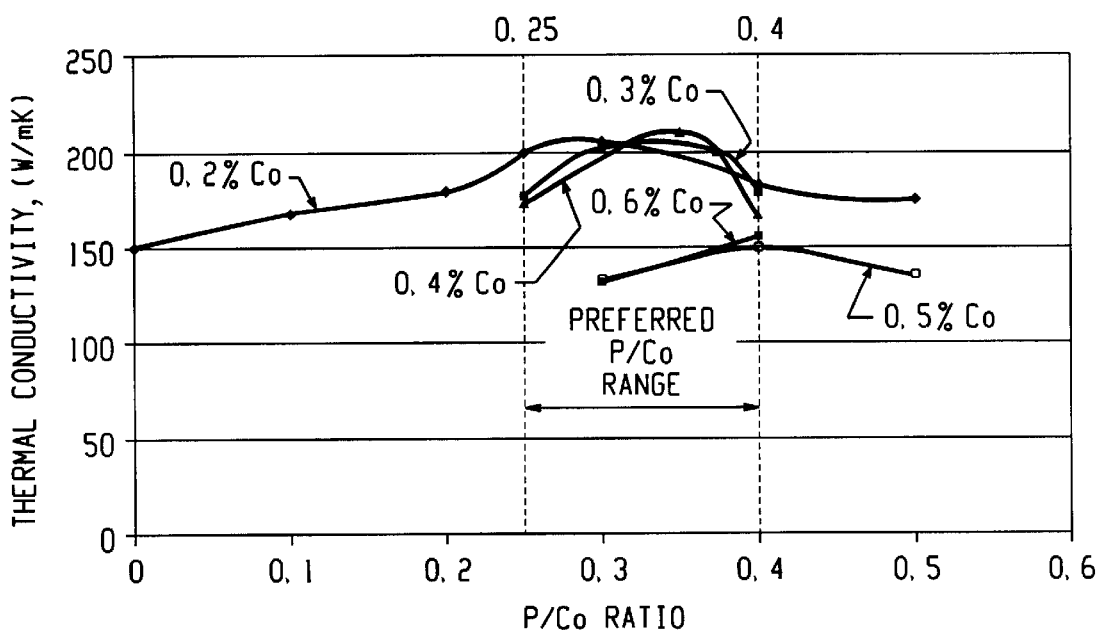
FIG. 4(c) is a graph illustrating the thermal conductivity as a function of the P/Co ratio for several 15/85 Cu/W composites containing about 0.2, 0.3, 0.4, 0.5 and 0.6 wt. % cobalt sintering aid.

FIG. 4(c) shows five thermal conductivity curves of 15% Cu/W composites containing from about 0.2% to about 0.6% cobalt with the phosphorus content ranging from about 0.02% to about 0.24%. The composites had a minimum acceptable thermal conductivity of about 170 W/mK when the P/Co ratio was within the preferred range of P/Co ratios of about 0.25 to about 0.4. The thermal conductivity was at least about 179 W/mK when composites contained from about 0.2% to about 0.4% cobalt and the P/Co ratio was from about 0.28 to about 0.38. The maximum measured thermal conductivity of the 15% Cu/W composites was about 204 W/mK.

It is apparent in FIG. 4(c) that the thermal conductivity of 15% Cu/W composites that contained from about 0.5% to about 0.6% by weight cobalt were substantially lower than the thermal conductivity of similar composites that contained less than about 0.5% cobalt and a P/Co ratio that was within the preferred range of P/Co ratios. Thus, even composites having a P/Co ratio that is within the preferred P/Co ratio range did not have improved thermal conductivity when the amount of sintering aid was beyond a threshold level. It is believed that although a metalloid containing cobalt and phosphorus is formed during sintering, the residual amount of the additives remaining in the copper phase, nevertheless, negatively affects the thermal conductivity of the composite. The threshold level of sintering aid is dependent upon the amount of copper in the composite and can be observed by comparing the thermal conductivity curves in FIG. 4(c) and FIG. 4(d).

Figure 4D:
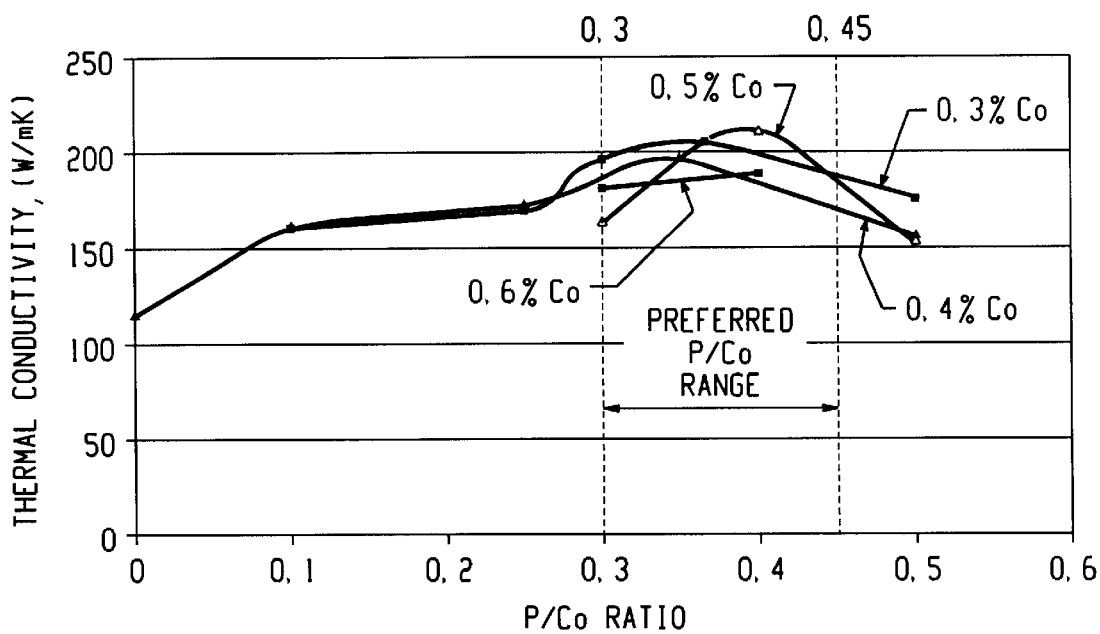
FIG. 4(d) is a graph illustrating the thermal conductivity as a function of the P/Co ratio for several 20/80 Cu/W composites containing about 0.3, 0.4, 0.5 and 0.6 wt. % cobalt sintering aid.

FIG. 4(d) illustrates thermal conductivity curves of 20% CU/W composites containing from about 0.3% to about 0.6% cobalt and a phosphorus concentration ranging from 0.03% to 0.24%. The line with arrows illustrates that the composites had a minimum acceptable thermal conductivity of about 180 W/mK when the P/Co ratio was in the preferred range of about 0.3 to about 0.45. The highest thermal conductivity measured of a 20% Cu/W composite was about 212 W/mK. A comparison of the curves of FIGS. 4(c) and 4(d) shows that composites containing a greater amount of copper have a higher threshold level of cobalt. The 20% Cu/W composites can achieve an improved thermal conductivity compared to 15% Cu/W composites while containing greater amounts of cobalt of up to about 0.6%. The data show that the thermal conductivity of a composite is negatively affected, regardless of the P/Co ratio, if the amount of cobalt present in a Cu/W composite exceeds the threshold level.

Figure 4E:
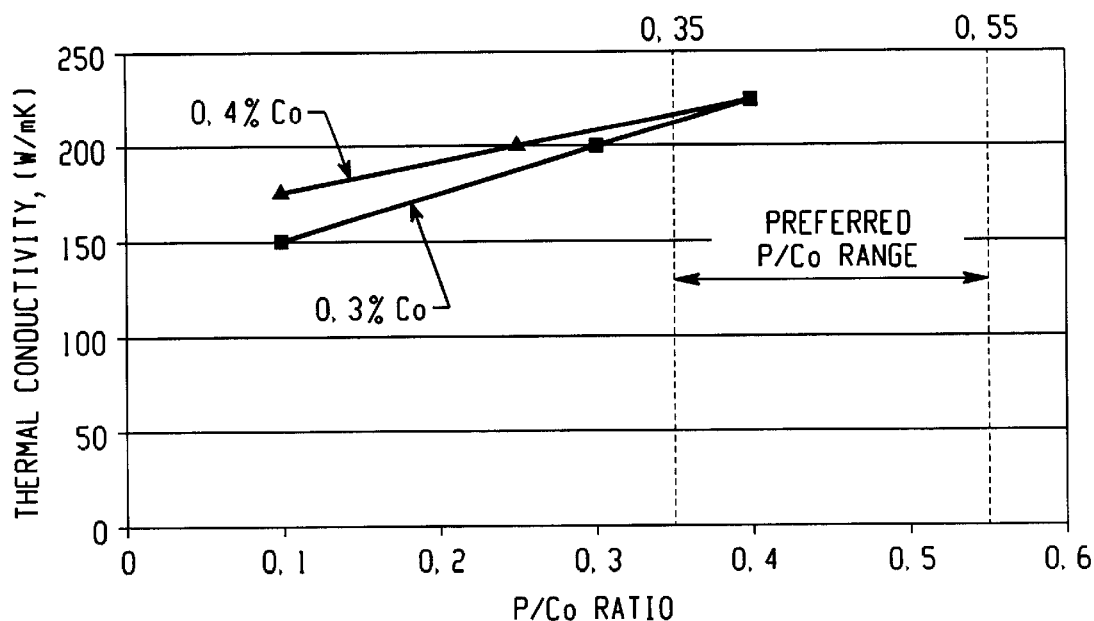
FIG. 4(e) is a graph illustrating the thermal conductivity as a function of the P/Co ratio for several 30/70 Cu/W composites containing about 0.3 and 0.4 wt. % cobalt sintering aid.

FIG. 4(e) illustrates the thermal conductivity of several 30% Cu/W composites containing about 0.3% to about 0.4% cobalt by weight. The graph is based on data for composites having a P/Co ratio only as high as about 0.4. The maximum measured thermal conductivity of the 30% Cu/W composites was about 224 W/mK, however, it is apparent that composites of the present invention having a higher thermal conductivity can be achieved when the P/Co ratio is greater than 0.4. The two thermal conductivity curves of FIG. 4(e) when extrapolated, in view of the trends displayed in the curves of FIGS. 4(a) through 4(d), show that the 30% Cu/W composites have a minimum acceptable P/Co ratio of about 210 W/mK when the P/Co ratio is within the range of preferred P/Co ratios of about 0.35 to about 0.55.

A comparison of FIGS. 4(a) through 4(e) show that copper/tungsten composites containing about 5% to about 30% copper have a range of preferred P/Co ratios that shifts toward greater P/Co ratios as the copper concentration increases. A comparison of FIGS. 4(a) through 4(d) show that copper/tungsten composites containing about 5% to about 20% copper have improved thermal conductivity at overlapping ranges of P/Co ratios of about 0.3 to about 0.38 when the cobalt concentration is from about 0.3% to about 0.4%.

Figure 5:
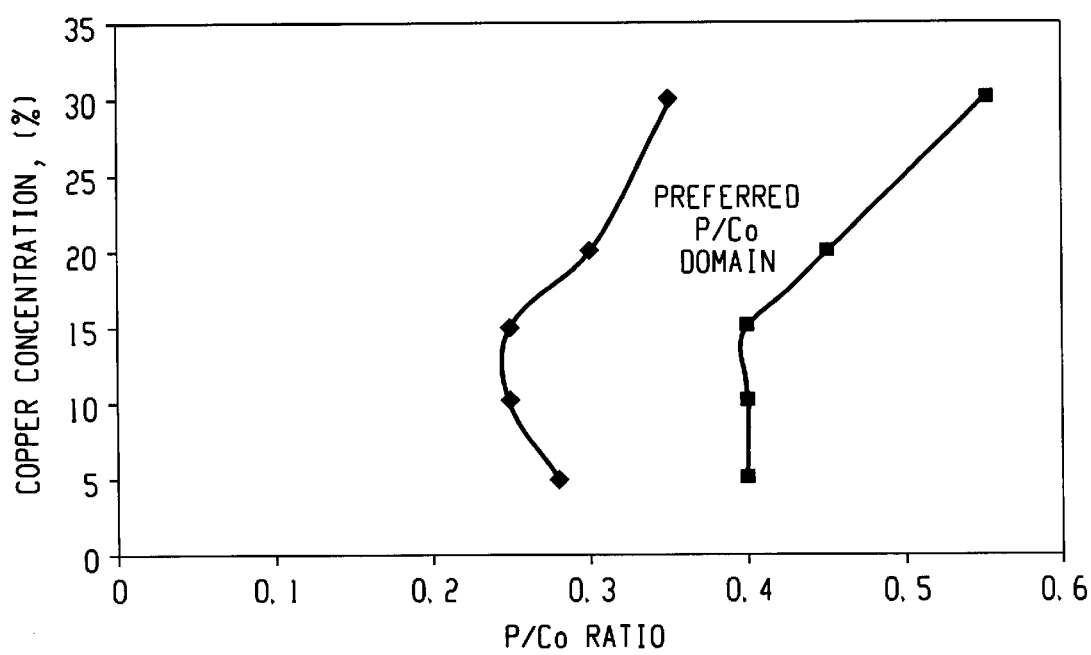
FIG. 5 is a graph derived from FIGS. 4(a) through 4(e) and illustrates the domain of P/Co ratios and copper concentrations of Cu/W composites in accordance with the present invention; and, FIG. 6 is a graph illustrating the minimum acceptable thermal conductivity as a function of the copper concentration for several Cu/W sintered composites of the present invention used in microelectronic applications.

FIG. 5 represents the domain of P/Co ratios for various composite concentrations of the present invention. The domain of preferred P/Co ratios is derived from FIGS. 4(a) through 4(e) and represents composites containing from about 5% to about 30% copper. The plotted points in FIG.

5 correspond to the P/Co at the arrow endpoints that define the range of preferred P/Co ratios in FIGS. 4(a) through 4(e). For example, at a copper concentration of about 5% the P/Co ratios of about 0.28 and about 0.4 correspond to the range of preferred P/Co ratios in FIG. 4(a). The figure shows that the threshold level of cobalt, and consequently, the domain of P/Co ratios is a function of the copper concentration. FIG. 5 clearly illustrates that the applicable range of preferred P/Co ratios is different, for example, the 15% Cu/W and 20% Cu/W composites as discussed above with respect to FIGS. 4(c) and 4(d).

Figure 6:
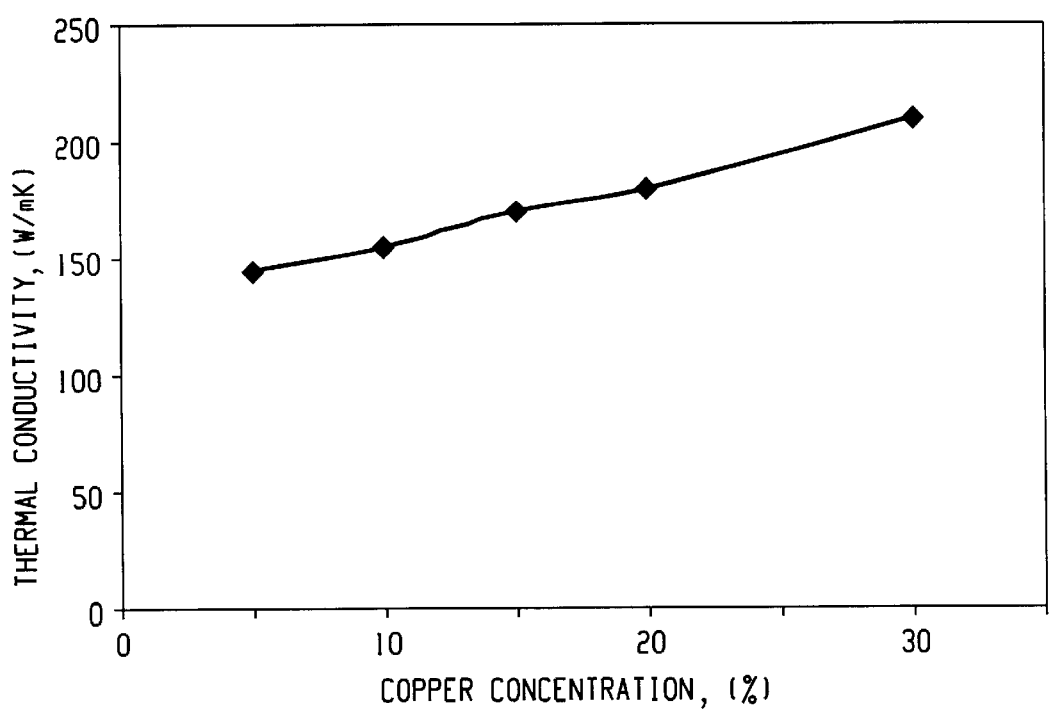

FIG. 6 is a graph illustrating the minimum acceptable thermal conductivity of a composite as a function of copper concentration. Composites having a fixed copper concentration have a minimum thermal conductivity at which the composite is useful in most applications. In microelectronic applications, for example, the substrates which are used to dissipate heat must have a thermal conductivity that is equal to or better than the minimum acceptable thermal conductivity in order to be effective. The thermal conductivity curve of FIG. 6 is derived from the thermal conductivity data of FIGS. 4(a) through 4(e) and also within the limits of the range of preferred P/Co ratios.

Although the above graphs show the specific thermal conductivity data of the composites tested having copper concentrations of 5%, 10%, 15%, 20% and 30%, it should be appreciated by those skilled in the art that the above interpretations pertaining to the data for the compositions also applies to composites having copper concentrations intermediate those shown on the graphs.

The process for making copper/refractory metal composites of the invention herein, result in composites having improved thermal conductivity and improved porosity. The process for making copper/refractory metal composites comprises: selecting powdered metals comprising copper, sintering aid, phosphorus and refractory metal, at least one of the copper and the refractory metal containing chemically-bound oxygen in an amount sufficient to improve a sintering process; mixing the powdered metals to form a mixture of powdered metals; forming a green compact with the mixture of powdered metals; and sintering the green compact containing chemically-bound oxygen in a reducing atmosphere to form a copper/refractory metal composite comprising by weight: from about 5% to about 30%, preferably from about 8% to about 22%, more preferably from about 9% to about 21%, even more preferably from about 10% to about 20% and yet even more preferably from about 10% to about 15% copper; from about 0.2% to about 0.6%, preferably from greater than about 0.2% to about 0.5%, more preferably from about 0.25% to about 0.45%, even more preferably from about 0.28% to about 0.4%, and even yet more preferably from about 0.3% to about 0.4% sintering aid; from about 0.08% to about 0.3%, preferably from about 0.09% to about 0.28%, more preferably from about 0.9% to about 0.24%, and even more preferably from about 0.09% to about 0.16% phosphorus; and the remainder is refractory metal. The resulting sintered composite is a net shape or near net shape part that has improved thermal conductivity, low residual porosity of less than about 1%, and a density that is at least about 99% of theoretical.

Powdered metals containing phosphorus can include, but is not limited to hydrated copper pyrophosphate powder, copper phosphate, copper phosphide or tungsten phosphide. In one aspect of the invention chemically-bound oxygen is present in the form of copper oxide, and oxygen may also be present in the form of moisture in the gas environment. Oxygen which is chemically-bound to any element in the system can also be used provided that the compound decomposes during sintering. Refractory metals include, but are not limited to, tungsten, molybdenum, chromium, iridium, osmium, tantalum, niobium, rhenium, rhodium, ruthenium, hafnium, zirconium and mixtures thereof. Sintering aids include cobalt, iron, nickel and mixtures thereof.

Improved sintering of powdered metals that include combinations of copper and chemically-bound oxygen is described in detail in U.S. Pat. No. 5,686,676 to Jech et al. and U.S. Pat. No. 5,993,731 to Jech et al., and are hereby incorporated by reference herein. The powdered metals are mixed in a wet slurry and then formed into agglomerates in a spray dry process. The agglomerates are compacted in a mold in either a hydraulic or mechanical press typically at 15,000 to 30,000 psi to form a green compact. The green compact is then sintered in a reducing atmosphere that is capable of reducing chemically-bound oxygen under sintering conditions. During sintering the chemically-bound oxygen is reduced and a copper/copper oxide eutectic is temporarily formed which has a lower melting point and lower viscosity than the other raw materials in the compact. Although applicants do not wish to be bound by any particular theory, it is believed that the eutectic is fully reduced during the final stages of sintering in the last sections of the furnace. The formation of the copper/copper oxide eutectic facilitates sintering through lowered processing temperature necessary for sintering or increasing the final product density, or both. In another aspect of the invention moisture is added to the sintering atmosphere to prolong the life of the metal oxide in the copper/copper oxide eutectic. Sufficient moisture such that a noticeable improvement in the sintering operation is achieved, either in terms of the density of the product obtained or a reduction in the sintering temperature. A sintering atmosphere having a dew point of about +20° C. down to about −10° C. is effective. The residual oxygen in the final copper/refractory metal composite is negligible.

WORKING EXAMPLES

In order to more fully and clearly describe the present invention so that those skilled in the art may better understand how to practice the present invention, the following examples are given. These examples are intended to illustrate the invention and should not be construed as limiting the invention disclosed and claimed herein in any manner.

Copper tungsten composites containing 5, 10, 15, 20, and 30% by weight copper were made according to the process described in Examples 1 through 5 below. The individual amounts of metal powder were employed such that the resulting weight percent of the sintered composites contained about 5% copper, about 0.2, 0.3, 0.4, 0.5 or 0.6% by weight cobalt and 0.08, 0.09, 0.11, 0.12, 0.14, or 0.16% by weight phosphorus according to the composites listed in Tables 1 through Table 5 below. Unless otherwise stated, density was measured by the Archimedes Method ASTM C373-88 (Reapp. 1994). Thermal diffusivity of the materials was measured by Laser-Flash method ASTM E 1561-92 and the thermal conductivity was then calculated from this value. A minimum of three samples for each test were produced and evaluated to ensure accuracy of the measured values.

Example 1

Copper tungsten composites containing 5% by weight copper were made according to the process below. The individual amounts of metal powder were employed such that the resulting weight percent of the sintered composites contained about 5% copper, about 0.3 or about 0.4% by weight cobalt and 0.03, 0.04 0.09, 0.12, or 0.16% by weight phosphorus according to the composites listed in Table 1 below.

Benzotriazole corrosion inhibitor, Cobratec 99 available from PMC Chemicals, was dissolved in deionized water. Isopropyl alcohol and particulate cuprous oxide were added to the benzotriazole solution. The mixture of cuprous oxide, benzotriazole and isopropyl was left to set aside for 12 hours.

Deionized water and cobalt metal powder having a mean particle size of 1 micron were charged into a mixing tank and mixed for ten minutes. Tungsten metal powder with a mean particle size of 1 micron was slowly added to the other ingredients in the mixing tank and mixed for 2 hours. Hydrated copper pyrophosphate ($Cu_2P_2O_7 \cdot xH_2O$) were then added to the mixture.

The previously made-up mixture of cuprous oxide, benzotriazole and isopropyl alcohol was added and the tungsten and copper pyrophosphate mixture and mixed for an additional 30 minutes. Rhoplex B-60A acrylic emulsion available from Rohm and Haas was then added and the mixture so obtained was mixed for an additional 30 minutes. Thereafter, the mixture was recovered and spray-dried to form a flowable mass of particulate agglomerates containing cuprous oxide, tungsten, copper pyrophosphate and cobalt.

Green compacts were made by compressing the flowable powdery mass in a pressing tool with a diameter of one inch at 25,000 psi. The green compacts were sintered in a batch furnace at 1200° C. for 60 minutes in a hydrogen atmosphere containing sufficient water to exhibit a +20° C. dew point.

Table 1 shows the thermal conductivity and densities of 5% copper composites with varying P/Co ratios and P:Co ratios. The P/Co ratio is the weight of Phosphorus divided by the weight of cobalt and the P:Co ratio is the normalized ratio.

TABLE 1

5/95 Cu/W Composites

| wt. % Co | wt. % P | P/Co | P:Co | TC (W/mK) | Porosity |
|---|---|---|---|---|---|
| 0.3 | 0.03 | 0.1 | 1:10 | 100 | <1% |
| 0.3 | 0.09 | 0.3 | 1:3.33 | 152 | <1% |
| 0.3 | 0.12 | 0.4 | 1:2.5 | 149 | <1% |
| 0.4 | 0.04 | 0.1 | 1:10 | 140 | <1% |
| 0.4 | 0.12 | 0.3 | 1:3.33 | 143 | <1% |
| 0.4 | 0.16 | 0.4 | 1:2.5 | 153 | <1% |

Example 2

Copper tungsten composites containing 10% copper were prepared in the same manner as described in Example 1. The individual amounts of metal powder employed were such that the resulting weight percent of the sintered composites contained about 10% copper, about 0.3 or 0.4% by weight cobalt and 0.03, 0.04 0.09, 0.12, or 0.16% by weight phosphorus according to the composites listed in Table 2 below:

TABLE 2

10/90 Cu/W Composites

| wt. % Co | wt. % P | P/Co | P:Co | TC W/mK | Porosity |
|---|---|---|---|---|---|
| 0.3 | 0.03 | 0.1 | 1:10 | 153 | <1% |
| 0.3 | 0.09 | 0.3 | 1:3.33 | 162 | <1% |
| 0.3 | 0.12 | 0.4 | 1:2.5 | 180 | <1% |
| 0.4 | 0.04 | 0.1 | 1:10 | 120 | <1% |
| 0.4 | 0.12 | 0.3 | 1:3.33 | 164 | <1% |
| 0.4 | 0.16 | 0.4 | 1:2.5 | 168 | <1% |

Example 3

Copper tungsten composites containing 15% copper were prepared in the same manner as described in Example 1. The individual amounts of metal powder employed were such that the resulting weight percent of the sintered composites contained about 15% copper, about 0.2, 0.3 or 0.4% by weight cobalt and 0, 0.02, 0.04, 0.06, 0.075, 0.08, 0.09, 0.10, 0.11, 0.12, 0.14, 0.15, 0.16%, 0.18, 0.20, 0.24, 0.25 by weight phosphorus according to the composites listed in Table 3 below.

TABLE 3

15/85 Cu/W Composites

| wt. % Co | wt. % P | P/Co | P:Co | TC W/mK | Porosity |
|---|---|---|---|---|---|
| 0.2 | 0 | 0 | n/a | 150 | <1% |
| 0.2 | 0.02 | 0.1 | 1:10 | 168 | <1% |
| 0.2 | 0.04 | 0.2 | 1:5 | 181 | <1% |
| 0.2 | 0.05 | 0.25 | 1:4 | 200 | <1% |
| 0.2 | 0.06 | 0.3 | 1:3.33 | 204 | <1% |
| 0.2 | 0.08 | 0.4 | 1:2.5 | 181 | <1% |
| 0.2 | 0.10 | 0.5 | 1:2 | 176 | <1% |
| 0.3 | 0.075 | 0.25 | 1:4 | 179 | <1% |
| 0.3 | 0.09 | 0.3 | 1:3.33 | 200 | <1% |
| 0.3 | 0.11 | 0.367 | 1:2.72 | 199 | <1% |
| 0.3 | 0.12 | 0.4 | 1:2.5 | 179 | <1% |
| 0.4 | 0.10 | 0.25 | 1:4 | 174 | <1% |
| 0.4 | 0.14 | 0.35 | 1:2.86 | 204 | <1% |
| 0.4 | 0.16 | 0.4 | 1:2.5 | 168 | <1% |
| 0.5 | 0.15 | 0.3 | 1:2 | 133 | <1% |
| 0.5 | 0.20 | 0.4 | 1:2.5 | 149 | <1% |
| 0.5 | 0.25 | 0.5 | 1:2 | 136 | <1% |
| 0.6 | 0.18 | 0.3 | 1:3.33 | 131 | <1% |
| 0.6 | 0.24 | 0.4 | 1:1.25 | 155 | <1% |

Example 4

Copper tungsten composites containing 20% copper were prepared in the same manner as described in Example 1. The individual amounts of metal powder were employed such that the resulting weight percent of the sintered composites contained about 20% copper, about 0.3, 0.4, 0.5 or 0.6% by weight cobalt and 0, 0.03, 0.04, 0.09 0.075, 0.09, 0.10, 0.11, 0.14, 0.15, 0.18, 0.20, 0.24, or 0.25% by weight phosphorus according to the composites listed in Table 4 below.

TABLE 4

20/80 Cu/W Composites

| wt. % Co | wt. % P | P/Co | P:Co | TC W/mK | Porosity |
|---|---|---|---|---|---|
| 0.3 | 0.03 | 0.1 | 1:10 | 161.3 | <1% |
| 0.3 | 0.075 | 0.25 | 1:4 | 171.6 | <1% |
| 0.3 | 0.09 | 0.3 | 1:3.33 | 196.1 | <1% |
| 0.3 | 0.11 | 0.37 | 1:2.72 | 204.7 | <1% |

TABLE 4-continued

20/80 Cu/W Composites

| wt. % Co | wt. % P | P/Co | P:Co | TC W/mK | Porosity |
|---|---|---|---|---|---|
| 0.3 | 0.15 | 0.5 | 1:3 | 174.9 | <1% |
| 0.4 | 0 | 0 | n/a | 115 | <1% |
| 0.4 | 0.04 | 0.1 | 1:10 | 161 | <1% |
| 0.4 | 0.10 | 0.25 | 1:4 | 174 | <1% |
| 0.4 | 0.14 | 0.35 | 1:2.86 | 196 | <1% |
| 0.4 | 0.20 | 0.5 | 1:2 | 158 | <1% |
| 0.5 | 0.15 | 0.3 | 1:3.33 | 165 | <1% |
| 0.5 | 0.20 | 0.4 | 1:2.5 | 212 | <1% |
| 0.5 | 0.25 | 0.5 | 1:2 | 155 | <1% |
| 0.6 | 0.18 | 0.3 | 1:3.33 | 182 | <1% |
| 0.6 | 0.24 | 0.4 | 1:2.5 | 191 | <1% |

Example 5

Copper tungsten composites containing 30% copper were prepared in the same manner as described in Example 1. The individual amounts of metal powder were employed, such that the resulting weight percent of the sintered composites contained about 30% copper, about 0.3 or 0.4% by weight cobalt and 0.03, 0.04 0.09, 0.10, or 0.16% by weight phosphorus according to the composites listed in Table 5 below.

TABLE 5

30/70 Cu/W Composites

| wt. % Co | wt. % P | P/Co. | P:Co | TC (W/mK) | Porosity |
|---|---|---|---|---|---|
| 0.3 | 0.03 | 0.1 | 1:10 | 150 | <1% |
| 0.3 | 0.09 | 0.3 | 1:3.33 | 201 | <1% |
| 0.3 | 0.12 | 0.4 | 1:2.5 | 224.15 | <1% |
| 0.4 | 0.04 | 0.1 | 1:10 | 175.6 | <1% |
| 0.4 | 0.10 | 0.25 | 1:4 | 201.15 | <1% |
| 0.4 | 0.16 | 0.4 | 1:2.5 | 223.65 | <1% |

All such modifications and variations of the present invention are possible in light of the above teachings. For example, the data show composites containing cobalt as the sintering aid and tungsten as the refractory metal, however, many modifications can be made with respect to disclosed sintering aids and mixtures thereof and with respect to the refractory metal without departing from the spirit and scope of the invention.

We claim:

1. A copper/refractory metal matrix composite comprising:
   from about 5% to about 30% by weight copper;
   from about 0.2% to about 0.6% by weight sintering aid;
   from 0.08% to about 0.3% by weight phosphorus;
   the remainder is refractory metal; and
   the phosphorus/sintering aid ratio ranges from about 0.25 to about 0.55.

2. A copper/refractory metal matrix composite that comprises:
   from 0.09% to about 0.24% by weight phosphorus;
   from about 5% to about 30% by weight copper;
   from about 0.2% to about 0.6% by weight sintering aid;
   the remainder is refractory metal; and
   the phosphorus/sintering aid ratio ranges from about 0.25 to about 0.55.

3. The copper/refractory metal matrix composite of claim 2 wherein the composite has a porosity of less than about 1%.

4. The copper/refractory metal matrix composite of claim 2 wherein the sintering aid is selected from the group consisting of: cobalt, iron, nickel and mixtures thereof.

5. The copper/refractory metal matrix composite of claim 2 wherein the sintering aid is cobalt.

6. The copper/refractory metal matrix composite of claim 2 wherein the refractory metal is selected from the group consisting of tungsten, molybdenum, chromium, iridium, osmium, tantalum, niobium, ruthenium, rhenium, rhodium, hafnium, zirconium and mixtures thereof.

7. The copper/refractory metal matrix composite of claim 5 wherein the refractory metal is tungsten.

8. The copper/refractory metal matrix composite of claim 7 wherein the copper/refractory metal composite contains an amount of cobalt that is greater than about 0.2% by weight and no greater than about 0.6% by weight and the copper/refractory metal composite has a P/Co weight ratio that ranges from about 0.25 to about 0.55.

9. The copper/refractory metal matrix composite of claim 7 wherein the composite has a thermal conductivity of at least about 145 W/mK when the copper concentration is at least 5%, has a thermal conductivity that is at least about 155 W/mK when the copper concentration is at least about 10%, a thermal conductivity of at least about 170 W/mK when the copper concentration is at least about 15%, a thermal conductivity of at least about 180 W/mK when the copper concentration is at least about 20%, a thermal conductivity of at least about 210 W/mK when the copper concentration is at least about 30%.

10. The copper/refractory metal matrix composite of claim 7 comprising:
    from about 8% to about 22% by weight copper;
    from about 0.25% to about 0.4% by weight cobalt;
    an amount of phosphorus such that the P/Co weight ratio is from about 0.25 to about 0.4; and
    the remainder is tungsten.

11. The copper/refractory metal matrix composite of claim 7 comprising:
    from about 10% to about 20% by weight copper;
    from about 0.3% to about 0.4% by weight cobalt; and,
    an amount of phosphorus such that the P/Co weight ratio ranges from about 0.3 to about 0.38; and
    the remainder is tungsten.

12. The copper/refractory metal matrix composite of claim 11 wherein the composite comprises from about 0.3% to about 0.4% cobalt and P/Co ratio is from about 0.3 to about 0.38 and the composite has a thermal conductivity that is at least about 162 W/mK when the copper concentration is about 10% or greater, a thermal conductivity that is at least about 179 W/mK when the copper concentration is about 15% or greater.

13. The copper/refractory metal matrix composite of claim 7 comprising:
    from about 10% to about 15% by weight copper;
    from about 0.3% to about 0.4 % by weight cobalt;
    an amount of phosphorus such that the P/Co weight ratio ranges from about 0.3 to about 0.4; and
    the remainder is tungsten.

14. The copper/refractory metal matrix composite of claim 13 wherein the thermal conductivity of the composite is at least about 162 W/mK.

15. The copper/refractory metal matrix composite of claim 2 further comprising a heat-generating component attached thereon.

16. The copper/refractory metal matrix composite of claim 1 wherein the composite comprises:

from about 8% to about 22% by weight copper; and the phosphor/sintering aid ratio ranges from about 0.28 to about 0.45.

17. The copper/refractory metal matrix composite of claim 16 wherein:

the sintering aid is selected from the group consisting of cobalt, iron, nickel and mixtures thereof; and the refractory metal is selected from the group consisting of tungsten, molybdenum, chromium, iridium, osmium, tantalum, niobium, ruthenium, rhenium, rhodium, hafnium, zirconium and mixtures thereof.

18. The copper/refractory metal matrix composite of claim 16 which comprises:

from about 10% to about 20% by weight copper; and the phosphorus/sintering aid ratio ranges from about 0.27 to about 0.4.

19. The copper/refractory metal matrix composite of claim 18 wherein the sintering aid is cobalt.

20. The copper/refractory metal matrix composite of claim 19 wherein the refractory metal is tungsten.

* * * * *